(12) United States Patent
Li et al.

(10) Patent No.: US 8,513,968 B2
(45) Date of Patent: Aug. 20, 2013

(54) MANIPULATOR OF ROBOT

(75) Inventors: Shen-Chun Li, Taipei Hsien (TW); Hsien-Chuan Liang, Taipei Hsien (TW); Wen-Laing Tseng, Taipei Hsien (TW); Yu-Chang Pai, Taipei Hsien (TW); Shou-Kuo Hsu, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 475 days.

(21) Appl. No.: 12/884,211

(22) Filed: Sep. 17, 2010

(65) Prior Publication Data

US 2012/0025857 A1 Feb. 2, 2012

(51) Int. Cl.
*G01R 31/02* (2006.01)
(52) U.S. Cl.
USPC .......... 324/754.03; 324/765.01; 324/72.5; 324/750.16

(58) Field of Classification Search
USPC .......... 324/765.01, 754.03, 72.5, 750.16; 269/53
See application file for complete search history.

(56) References Cited

U.S. PATENT DOCUMENTS 5,538,305 A * 7/1996 Conway et al. ............ 294/119.1

* cited by examiner

*Primary Examiner* — Arleen M Vazquez
*Assistant Examiner* — Son Le
(74) *Attorney, Agent, or Firm* — Altis Law Group, Inc.

(57) ABSTRACT

An exemplary manipulator of a robot includes a fastening seat defining two guiding grooves, a driving mechanism disposed on the fastening seat, two transmitting plates respectively received in the two guiding grooves and cooperating with the driving mechanism, and two detecting bars each fixedly connecting with a corresponding transmitting plate. A detecting pin is fixed on each of the detecting bars. Under a driving action of the driving mechanism on the transmitting plates, the transmitting plates are activated to slide in the guiding grooves to cause the detecting bars to move close to or apart from each other, whereby a distance between the two detecting pins is automatically regulated.

18 Claims, 4 Drawing Sheets

MANIPULATOR OF ROBOT

BACKGROUND

1. Technical Field

The disclosure relates to manipulators of robots.

2. Description of Related Art

Manipulators of robots are widely used in product test procedures as a substitute for manual work. For example, in a procedure for testing a printed circuit board (PCB), a manipulator having a pair of detecting pins respectively used as an anode and a cathode moves along three axes of a three-dimensional coordinate system to precisely contact pairs of electrical nodes on the PCB and test for whether bad electrical connections of the electrical nodes exist or not. However, since the distances between the pairs of the electrical nodes on the PCB are different from each other, the distance between the two detecting pins needs to be regulated. This is typically done by a human operator using a hand tool such as a wrench. The wrench is used to twist a portion of the manipulator. Thus the task of making the detecting pins align with the electrical nodes on the PCB is time consuming and adds to costs.

What is needed, therefore, is a manipulator of a robot which can overcome the limitations described.

DETAILED DESCRIPTION

Figure 1:
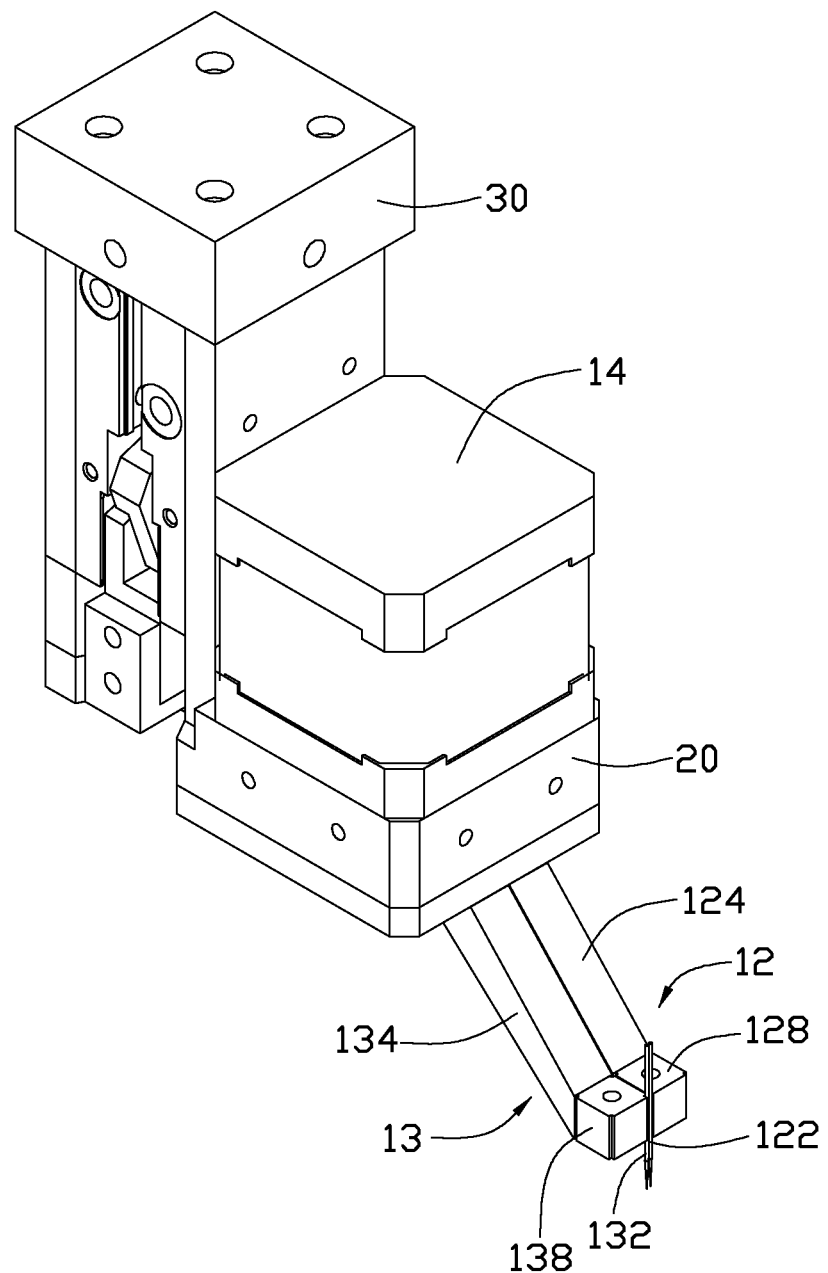
FIG. 1 is an assembled, isometric view of a manipulator of a robot in accordance with an embodiment of the disclosure.
Figure 2:
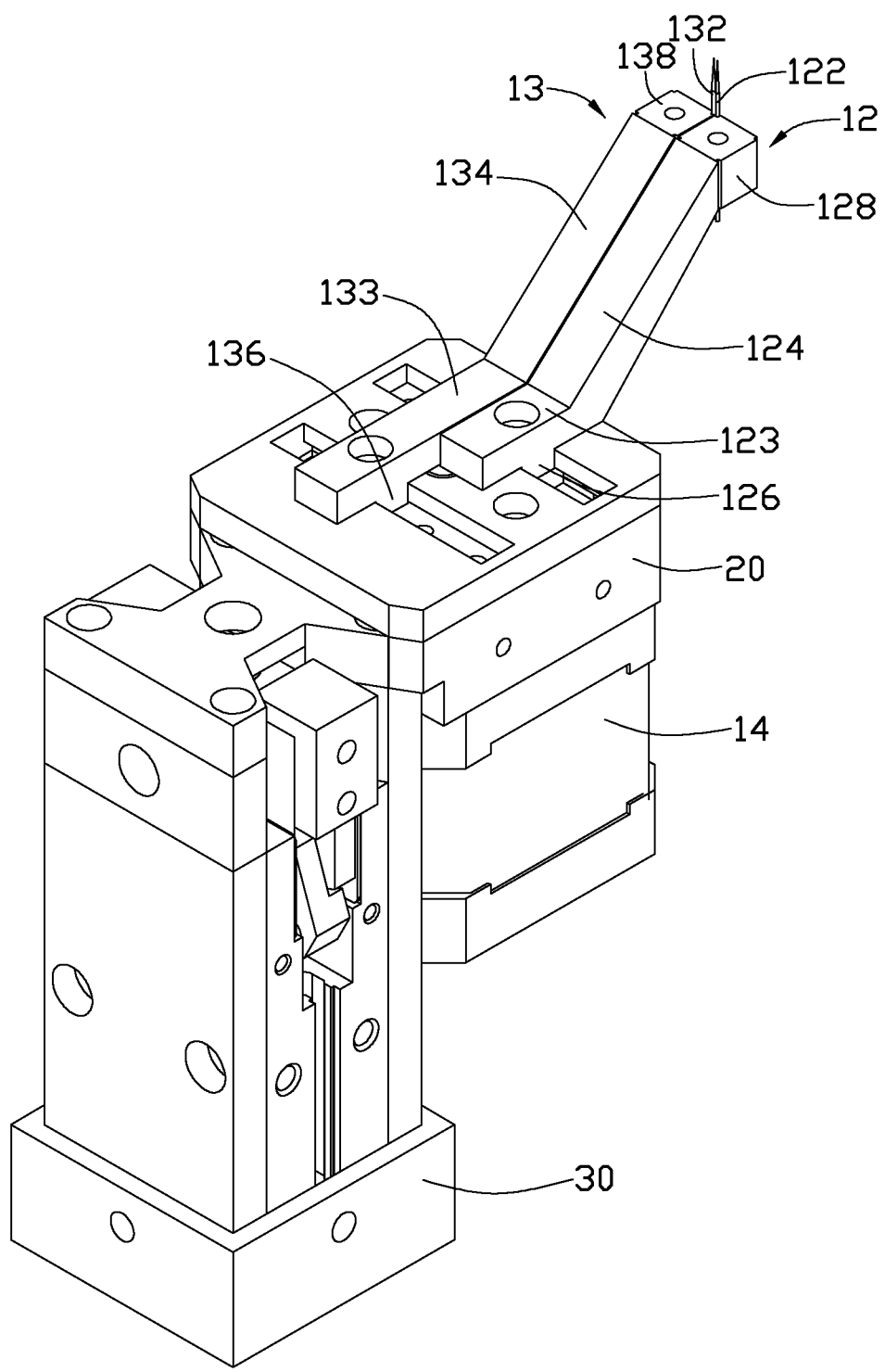
FIG. 2 is a view of the manipulator of FIG. 1, but showing the manipulator inverted.

Referring to FIGS. 1-2, a manipulator of a robot in accordance with an embodiment is shown. The manipulator includes a first detecting bar 12, a second detecting bar 13, a fastening seat 20, a driving device 14 fastened on the fastening seat 20, and a fixing device 30 fixed to the fastening seat 20.

The first and second detecting bars 12, 13 include two detecting pins 122, 132 respectively used as an anode and a cathode for precisely contacting pairs of electrical nodes on a printed circuit board (not shown) and detecting whether bad electrical connections between the electrical nodes exist or not. The first and second detecting bars 12, 13 further include horizontal sections 123, 133, slantwise sections 124, 134 extending obliquely downwardly from the horizontal sections 123, 133, and protrusions 126, 136 extending vertically upwardly from top faces of the horizontal sections 123, 133. The horizontal section 133 of the second detecting bar 13 is longer than the horizontal section 123 of the first detecting bar 12. Horizontal portions 128, 138 horizontally extend from bottom ends of the slantwise sections 124, 134. The detecting pins 122, 132 are respectively fixed to inner sides of the horizontal portions 128, 138.

Figure 3:
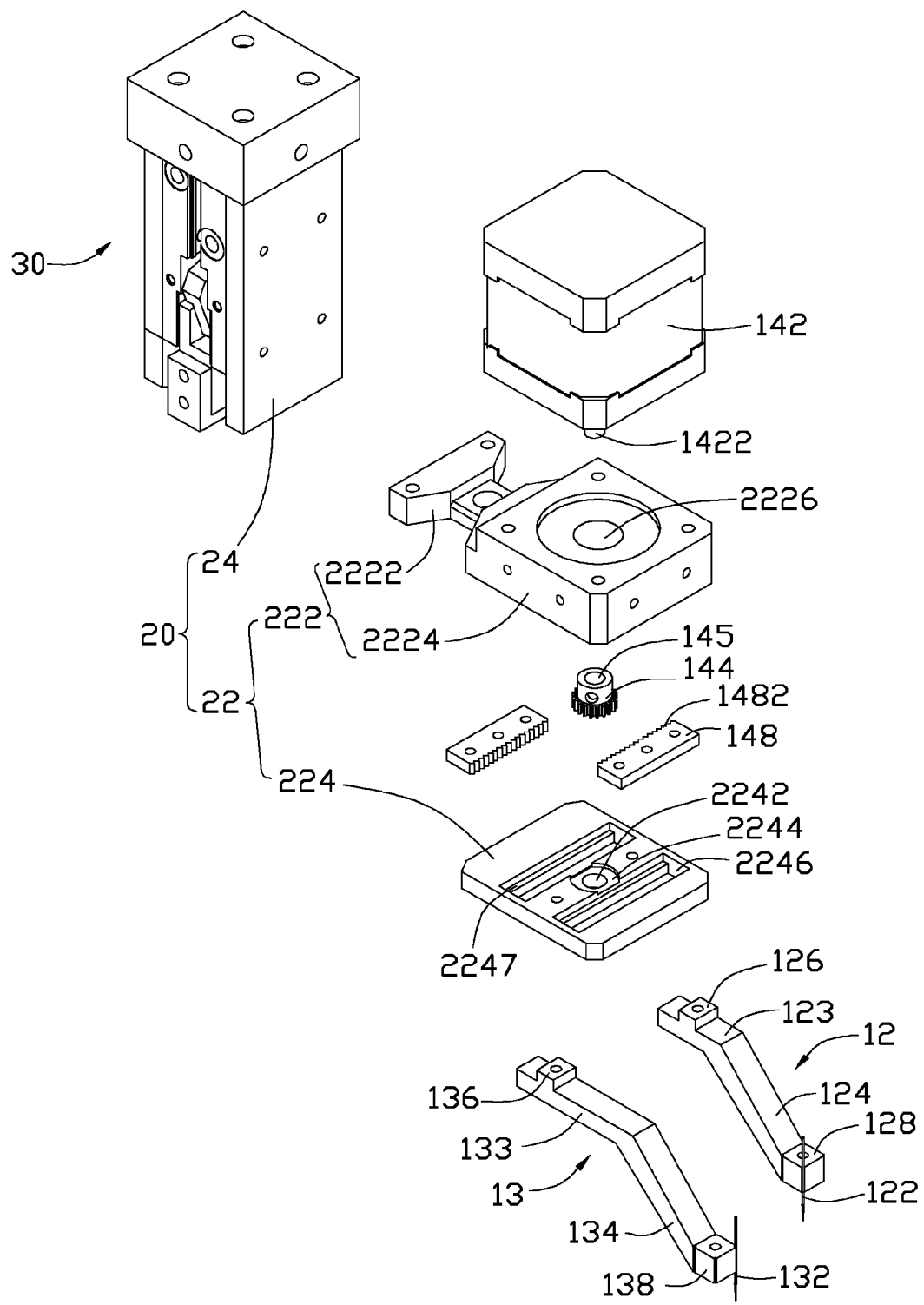
FIGS. 3-4 are exploded views of the manipulator of FIG. 1.

Also referring to FIG. 3, the driving device 14 includes a driving mechanism and a transmitting mechanism. The driving mechanism includes a stepping motor 142 and a gear 144. The stepping motor 142 includes a rotating shaft 1422. The gear 144 defines a circular through hole 145 in a center thereof, and a plurality of teeth at an outer circumference thereof. The transmitting mechanism includes two transmitting plates 148 respectively located at two opposite sides of the gear 144. Each transmitting plate 148 is elongated and substantially rectangular, and defines a plurality of teeth 1482 at a lateral side facing the gear 144 for meshing with the teeth of the gear 144.

Figure 4:
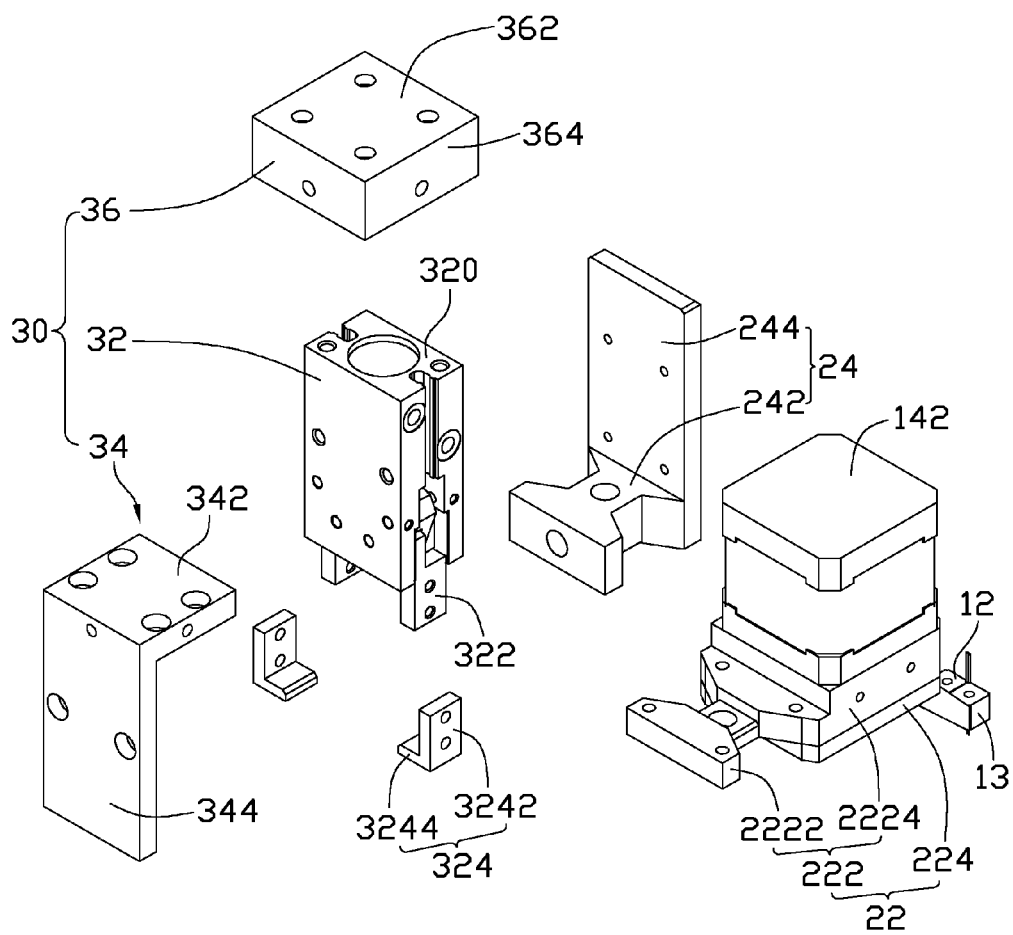

Also referring to FIG. 4, the fastening seat 20 includes a holding mechanism 22, and a connecting mechanism 24 disposed on the holding mechanism 22. The connecting mechanism 24 includes a generally X-shaped neck 242, and a vertical plate 244 extending vertically upwardly from an end of the neck 242. Particularly referring to FIG. 3, the holding mechanism 22 includes a cover 222 and a rectangular bottom plate 224 fastened at a bottom of the cover 222. The cover 222 includes a generally X-shaped fixing portion 2222 corresponding to the neck 242 of the connecting mechanism 24, and a holding portion 2224 located at an end of the fixing portion 2222. The holding portion 2224 is substantially rectangular, and defines a circular through hole 2226 in a center thereof. The bottom plate 224 defines a circular through hole 2242 in a center thereof, and an annular groove 2244 around the through hole 2242. The annular groove 2244 has an outer diameter larger than that of the through hole 2242, and is used for receiving the gear 144. The bottom plate 224 defines two elongated, rectangular guiding grooves 2246 at two opposite sides of the annular groove 2244. The guiding grooves 2246 are parallel to each other and in communication with the annular groove 2244. Each guiding groove 2246 has a width at a top larger than a width at a bottom, so that a step portion 2247 is formed where the top and the bottom of the guiding groove 2246 meet. The width of the top of each guiding groove 2246 is substantially equal to the width of each transmitting plate 148. A length of each guiding groove 2246 is longer than that of each transmitting plate 148.

Particularly referring to FIG. 4, the fixing device 30 includes a sandwiching mechanism 32, a fastening mechanism 34 fastening the sandwiching mechanism 32 thereon, and a connecting mechanism 36 connecting the fastening mechanism 34. The sandwiching mechanism 32 includes a rectangular main body 320, and two sandwiching claws 322 located at two sides of a bottom end of the main body 320. Two claw portions 324 are respectively fastened on the two sandwiching claws 322. Each of the claw portions 324 is substantially L-shaped, and includes a side plate 3242 and a bending plate 3244 perpendicular to the side plate 3242. The fastening mechanism 34 is substantially L-shaped, and includes a rectangular horizontal plate 342 and a rectangular vertical plate 344 extending downwardly vertically from an end of the horizontal plate 342. The connecting mechanism 36 is adapted for fastening the manipulator on a robot arm (not shown). The connecting mechanism 36 includes a connecting plate 362, and four side walls 364 extending from a side of the connecting plate 362, whereby the connecting plate 362 and the side walls 364 cooperatively form a receiving space (not labeled). The robot arm is connected to the connecting plate 362.

In assembly, the transmitting plates 148 are received in the top of the guiding grooves 2246 of the bottom plate 224, making the teeth 1482 of the transmitting plates 148 face the through hole 2242 of the bottom plate 224. The protrusions 126, 136 of the first and second detecting bars 12, 13 extend upwardly through the bottom of the guiding grooves 2246 of the bottom plate 224, and are fixed to the transmitting plates 148. The gear 144 of the driving device 14 is received in the annular groove 2244 of the bottom plate 224, and the teeth of the gear 144 mesh with the teeth 1482 of the transmitting plates 148. The cover 222 is fastened on the top of the bottom plate 224. The stepping motor 142 is fastened on a top of the cover 222, and the rotating shaft 1422 of the stepping motor 142 extends through the through hole 2226 of the cover 222, the through hole 145 of the gear 144 and the through hole 2242 of the bottom plate 224 in sequence, and is fastened on the gear 144. The neck 242 of the fastening seat 20 is sandwiched between the two sandwiching claws 322 of the sandwiching mechanism 32. The fastening mechanism 34 is placed on the sandwiching mechanism 32, making the horizontal plate 342 of the fastening mechanism 34 abut against a top face the main body 320 of the sandwiching mechanism 32. The vertical plate 344 of the fastening mechanism 34 and the vertical plate 244 of the connecting mechanism 24 are respectively fixedly connected to two opposite sides of the main body 320 of the sandwiching mechanism 32. The horizontal plate 342 of the fastening mechanism 34 is received in the receiving space of the connecting mechanism 36 and fastened on the connecting plate 362. The fixing portion 2222 of the cover 222 is attached to a bottom of the neck 242 of the connecting mechanism 24.

In use, the manipulator is connected to the robot arm via the connecting mechanism 36. Under control of predetermined programs, the stepping motor 142 runs to cause the gear 144 to rotate, and the gear 144 causes the transmitting plates 148 to horizontally slide in the guiding grooves 2246 of the bottom plate 224. With the transmitting plates 148 sliding, the first and second detecting bars 12, 13 with the detecting pins 122, 132 move closer to or farther apart from each other, to thereby automatically regulate a distance between the two detecting pins 122, 132. Thus, the detecting pins 122, 132 can precisely align with and contact pairs of the electrical nodes on the printed circuit board and speedily detect whether bad electrical connections of the electrical nodes exist or not.

It is to be understood, however, that even though numerous characteristics and advantages of the embodiment have been set forth in the foregoing description, together with details of the structures and functions of the embodiment, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A manipulator of a robot, the manipulator comprising:
    a fastening seat defining two guiding grooves and comprising a neck;
    a driving mechanism disposed on the fastening seat;
    two transmitting plates respectively received in the two guiding grooves and operatively connected with the driving mechanism;
    two detecting bars each fixedly connecting with a corresponding transmitting plate, a detecting pin being fixed on each of the detecting bars; and
    a fixing device fastened on the fastening seat, the fixing device comprising a sandwiching mechanism, a fastening mechanism fastening the sandwiching mechanism, and a connecting mechanism connecting the fastening mechanism, the connecting mechanism being adapted for fastening the manipulator on a robot arm, the sandwiching mechanism comprising two sandwiching claws at an end, the neck of the fastening seat being sandwiched between the two sandwiching claws;
    wherein under a driving action of the driving mechanism on the transmitting plates, the transmitting plates are activated to slide in the guiding grooves to cause the detecting bars to move closer to or farther apart from each other, whereby a distance between the two detecting pins is automatically regulated.

2. The manipulator of claim 1, wherein the driving mechanism comprises a stepping motor disposed on the fastening seat.

3. The manipulator of claim 2, wherein the driving mechanism further comprises a gear connected between the stepping motor and the transmitting plates.

4. The manipulator of claim 3, wherein the stepping motor comprises a rotating shaft, the gear defining a through hole in a center thereof, the rotating shaft of the stepping motor extending through the through hole of the gear and being fastened on the gear.

5. The manipulator of claim 4, wherein a plurality of teeth are defined at a side of each of the transmitting plates, the transmitting plates being located at two opposite sides of the gear, the gear meshing with the teeth of the transmitting plates.

6. The manipulator of claim 5, wherein the fastening seat comprises a cover connecting the neck, the stepping motor being fastened on a top of the cover, the cover defining a through hole, the rotating shaft of the stepping motor extending through the through hole of the cover and being fastened on the gear.

7. The manipulator of claim 6, wherein the fastening seat further comprises a bottom plate fastened on a bottom of the cover, the guiding grooves being defined in the bottom plate, the gear being located between the two guiding grooves.

8. The manipulator of claim 7, wherein the bottom plate defines an annular groove between the two guiding grooves, the gear being received in the annular groove.

9. The manipulator of claim 1, wherein the fastening mechanism comprises a horizontal plate and a vertical plate extending from an end of the horizontal plate, the connecting mechanism comprises a connecting plate and four side walls extending from a side of the connecting plate, and the connecting plate and the side walls cooperatively form a receiving space, the sandwiching mechanism being fastened on the vertical plate of the fastening mechanism, the horizontal plate of the fastening mechanism being received in the receiving space and fastened on the connecting plate of the connecting mechanism.

10. A manipulator of a robot, the manipulator comprising:
    a fastening seat defining two guiding grooves and comprising a neck;
    a stepping motor disposed on the fastening seat;
    two transmitting plates respectively received in the two guiding grooves and operatively coupled to the stepping motor;
    two detecting bars each fixedly connecting with a corresponding transmitting plate, a detecting pin being fixed on each of the detecting bars; and
    a fixing device fastened on the fastening seat, the fixing device comprising a sandwiching mechanism, a fastening mechanism fastening the sandwiching mechanism, and a connecting mechanism connecting the fastening mechanism, the connecting mechanism being adapted for fastening the manipulator on a robot arm, the sandwiching mechanism comprising two sandwiching claws at an end, the neck of the fastening seat being sandwiched between the two sandwiching claws;
    wherein when the stepping motor runs, the transmitting plates are driven by the stepping motor to slide in the guiding grooves to cause the detecting bars to move closer to or farther apart from each other, whereby a distance between the two detecting pins is automatically regulated.

11. The manipulator of claim 10, further comprising a gear connected between the stepping motor and the transmitting plates.

12. The manipulator of claim 11, wherein the stepping motor comprises a rotating shaft, the gear defining a through hole in a center thereof, the rotating shaft of the stepping motor extending through the through hole of the gear and being fastened on the gear.

13. The manipulator of claim 12, wherein a plurality of teeth are defined at a side of each of the transmitting plates, the transmitting plates being located at two opposite sides of the gear, the gear meshing with the teeth of the transmitting plates.

14. The manipulator of claim 13, wherein the fastening seat comprises a cover connecting the neck, the stepping motor being fastened on a top of the cover, the cover defining a through hole, the rotating shaft of the stepping motor extending through the through hole of the cover and being fastened on the gear.

15. The manipulator of claim 14, wherein the fastening seat further comprises a bottom plate fastened on a bottom of the cover, the guiding grooves being defined in the bottom plate, the gear being located between the two guiding grooves.

16. The manipulator of claim 15, wherein the bottom plate defines an annular groove between the two guiding grooves, the gear being received in the annular groove.

17. The manipulator of claim 10, wherein the fastening mechanism comprises a horizontal plate and a vertical plate extending from an end of the horizontal plate, the connecting mechanism comprises a connecting plate and four side walls extending from a side of the connecting plate, and the connecting plate and the side walls cooperatively form a receiving space, the sandwiching mechanism being fastened on the vertical plate of the fastening mechanism, the horizontal plate of the fastening mechanism being received in the receiving space and fastened on the connecting plate of the connecting mechanism.

18. The manipulator of claim 10, wherein each of the transmitting plates is elongated.

* * * * *